United States Patent
Li et al.

(10) Patent No.: US 10,020,072 B2
(45) Date of Patent: Jul. 10, 2018

(54) DETECT DEVELOPED BAD BLOCKS IN NON-VOLATILE MEMORY DEVICES

(71) Applicant: SK Hynix Inc., Gyeonggi-do (KR)

(72) Inventors: Haibo Li, Cupertino, CA (US); Sangsik Kim, San Jose, CA (US); Juhyeon Han, San Jose, CA (US)

(73) Assignee: SK Hynix Inc., Gyeongi-do (KR)

( * ) Notice: Subject to any disclaimer, the term of this patent is extended or adjusted under 35 U.S.C. 154(b) by 0 days.

(21) Appl. No.: 15/288,603

(22) Filed: Oct. 7, 2016

(65) Prior Publication Data

US 2017/0294237 A1    Oct. 12, 2017

Related U.S. Application Data

(60) Provisional application No. 62/320,377, filed on Apr. 8, 2016.

(51) Int. Cl.
*G11C 29/38* (2006.01)
*G11C 11/56* (2006.01)
*G11C 29/44* (2006.01)

(52) U.S. Cl.
CPC .......... *G11C 29/38* (2013.01); *G11C 11/5628* (2013.01); *G11C 11/5642* (2013.01); *G11C 29/44* (2013.01)

(58) Field of Classification Search
None
See application file for complete search history.

(56) References Cited

U.S. PATENT DOCUMENTS

| | | | |
|---|---|---|---|
| 2009/0091990 A1* | 4/2009 | Park | G11C 11/5628 365/189.011 |
| 2011/0173484 A1 | 7/2011 | Schuette | |
| 2012/0226963 A1* | 9/2012 | Bivens | G11C 29/42 714/773 |
| 2014/0164880 A1 | 6/2014 | Chen | |
| 2014/0334228 A1* | 11/2014 | Kim | G06F 11/1072 365/185.03 |
| 2016/0098216 A1 | 4/2016 | Huang | |
| 2016/0179602 A1* | 6/2016 | Gorobets | G06F 3/0653 714/47.2 |

OTHER PUBLICATIONS

Bora Peleato et al "Titled: BER-Based Wear Leveling and Bad Block Management for NAND Flash," International Conference on Communications (ICC), Jun. 8-12, 2015.

* cited by examiner

*Primary Examiner* — Mujtaba M Chaudry
(74) *Attorney, Agent, or Firm* — Kilpatrick Townsend & Stockton LLP

(57) ABSTRACT

Systems and methods are provided to detect a developed bad word-line of a flash memory. Embodiments provide an improved Background media scan (BGMS) process that can predict at the end of a block read if a word-line will potentially become bad with the use of the flash memory. Accordingly, data from the potentially bad block can be recovered and the block can be retired. The embodiments can minimize the need for the expensive chip-kill method.

20 Claims, 7 Drawing Sheets

DETECT DEVELOPED BAD BLOCKS IN NON-VOLATILE MEMORY DEVICES

CROSS-REFERENCES TO RELATED APPLICATIONS

This application is a non-provisional application and claims the benefit and priority of U.S. Provisional Application No. 62/320,377, filed on Apr. 8, 2016, titled "BACKGROUND MEDIA SCAN METHOD TO DETECT THE DEVELOPED BAD BLOCKS DURING SSD USAGE," which is herein incorporated by reference in its entirety for all purposes.

BACKGROUND OF THE INVENTION

Non-volatile memory devices such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' or 'flash memory devices' (for example, NAND and NOR flash memory devices), are used in media storage, cameras, mobile phones, mobile computers, laptop computers, USB flash drives, etc. Non-volatile memory can provide a relatively reliable, compact, cost-effective, and easily accessible method of storing data when the power is off.

NAND flash devices are generally made up of blocks comprising a number of pages. Each page can comprise multiple NAND flash cells, e.g., hundreds or thousands. A NAND flash cell may be a single level cell (SLC) that can represent one bit per cell, or a multi-level cell (MLC) that can represent two or more bits per cell. Each cell can hold a voltage to indicate a value stored in physically identical flash cells. For example, the SLC can store two values "1" or a "0" using the single bit. The MLC can store four values "10", "01", "11" and "00" using the two bits.

NAND flash devices are not always manufactured perfectly. For example, some blocks may have physical defects which can become worse with time. Some blocks can be screened out at factory and some blocks can be marked as factory bad blocks. In some instances, a few bad blocks may be developed during usage. The bad blocks developed during usage are called developed bad blocks and may fail much earlier than normal blocks. Bad blocks can develop erratically and may be hard to predict. For example, in some instances, elevated heat or multiple program-erase (P/E) cycles can make the NAND flash devices susceptible to bit errors, thus causing them likely to fail.

Use of error correction codes (ECC), e.g., Hamming codes, parity, cyclic codes, etc., to detect and correct bit errors in NAND flash devices is known. A bit error rate (BER) or an error rate may be defined by a percentage of bits with errors to a total number of bits. In most instances, ECC can minimize possible errors and can help extend the life of the flash devices. However, in some instances, not all errors can be corrected. Under some approaches, SSD technologies can use "chipkill" method to rescue the data in case of an Uncorrectable by Error Correction Code (UECC) failure by other methods. For example, support of the chipkill feature may require an additional NAND flash device similar to the RAID (redundant array of inexpensive disks) solution, which can be used to recover the data upon failure of certain blocks. ChipKill can be a costly feature in flash devices as it can affect size of system data area, cost of development (hardware/firmware), Application Specific Integrated Circuit (ASIC) layout real estate, and power. Technology that can remove the need for chipkill can be beneficial.

Data have shown that most of the catastrophic failures taking place in the developed bad blocks are localized on a single or two neighboring word-lines (WLs), and they are caused by gradually developed defects. Background media scan (BGMS) can be performed to periodically monitor the reliability of the data written to the flash memory during idle/free time. It can detect performance degradation on NAND superblocks due to retention, and refresh (garbage collect) the superblock. If the refresh cannot improve the performance, the block can be retired when necessary. Under one approach, the BGMS can catch the worst WL bit error rate (BER) and compare with a pre-determined threshold. However, such an approach cannot detect the sign of a developed bad block and/or predict its failure.

According to some embodiments disclosed, an improved BGMS method can be used to detect the developed bad blocks during flash memory usage, with the hope of reducing or eliminating the need for "chipkill" in the flash memory devices.

BRIEF SUMMARY OF THE INVENTION

Embodiments of the invention pertain to systems, methods, and computer-readable instructions to provide an improved Background media scan (BGMS) process to detect a developed bad block during the flash memory usage. At the end of a block read, if it is determined that a maximum error rate of a word-line is significant higher than a corresponding average error rate (above a pre-determined ratio), the improved BGMS process can predict that the word-line with the maximum error rate is likely to develop into a bad word-line. Further if this maximum error rate is above a pre-determined threshold, the block can be retired.

According to some embodiments, a method can comprise reading, by a flash memory controller, a plurality of pages in a flash memory block of a flash memory, wherein the flash memory is coupled to the flash memory controller. The plurality of pages can be read at near-optimal read levels. Each page of the plurality of pages can comprise a plurality of M-level cells, each M-level cell storing M bits of data. The method further comprises determining an average error rate of the flash memory block, and determining a maximum error rate of a page in the flash memory block. In some embodiments, the average error rate can be determined by calculating a sum of error rates associated with the plurality of pages in the flash memory block, and dividing the sum by a number of pages in the plurality of pages. In some embodiments, the maximum error rate can be determined by identifying the page having a highest error rate among error rates associated with the plurality of pages.

The method can further comprise determining that a ratio of the maximum error rate to the average error rate exceeds a first threshold, and predicting that the flash memory block is going to be a bad block based on the ratio, and if the maximum error rate exceeds a second threshold. The method can further comprise based on the prediction copying data from the flash memory block to a free memory block, and retiring the flash memory block by marking the flash memory block as unusable.

In some embodiments, the plurality of pages can include pages associated with a most significant bit (MSB) of each M-level cell or pages associated with a least significant bit (LSB) of each M-level cell. As an example, the M can be 2 and the plurality of M-level cells can include multilevel cells (MLCs).

DETAILED DESCRIPTION OF THE INVENTION

Figure 1:
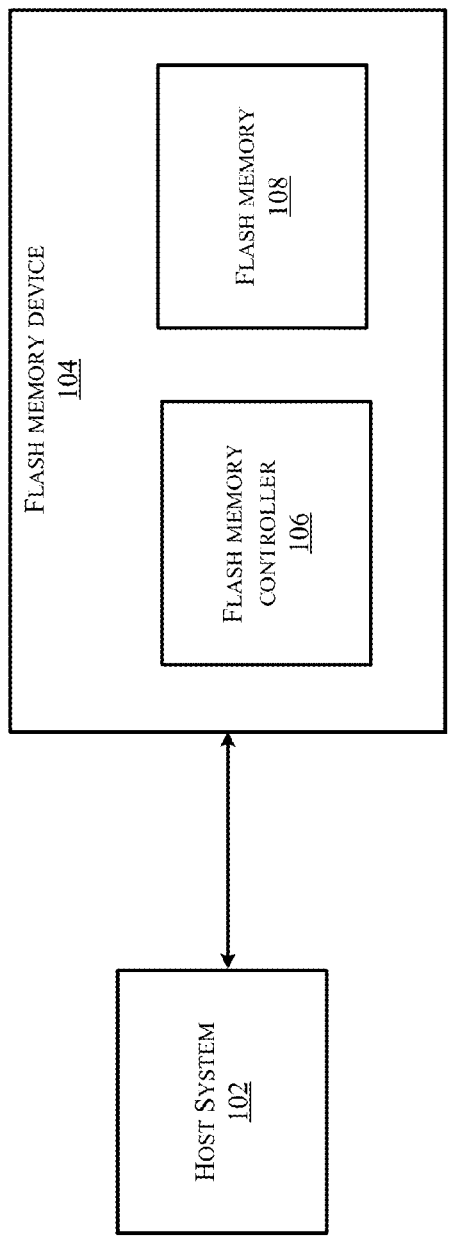
FIG. 1 is a simplified block diagram illustrating a system including a host system coupled to a flash memory device.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments. However, it will be apparent that various embodiments may be practiced without these specific details. The figures and description are not intended to be restrictive.

The ensuing description provides examples, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

The following detailed description together with the accompanying drawings in which the same reference numerals are sometimes used in multiple figures to designate similar or identical structures structural elements, provide a better understanding of the nature and advantages of the present invention.

Embodiments of the invention pertain to systems, methods, and computer-readable instructions for an improved background media scan (BGMS) process that can predict blocks in a flash memory that are going to be developed bad blocks. Methods, systems, and computer-readable media as described in the disclosure can be used, for example, in a NAND flash memory device.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

According to some described methods, accumulated average and maximum error rates on all read word-lines can be recorded for both LSB (Least Significant Bit) and MSB (Most Significant Bit) pages for each cell. In embodiments, the pages of a block can be read at near-optimal read levels.

At the end of the block read, if it is found that a maximum error rate for an either LSB or MSB page is significant higher (e.g., above a first pre-determined threshold) than a corresponding average value, the word-line with the maximum error rate is likely to develop into a bad word-line. Further, if this maximum error rate is above a second pre-determined threshold, this block can be retired. Some embodiments of the disclosure can have the potential to detect the developed bad blocks and eliminate the need of the expensive "chipkill" method. Using various embodiments, a block, which is in progress to develop into a bad block can be identified before it eventually becomes bad. Hence, loss of data can be prevented by recovering the data from a possible bad block before the block develops into the bad block from which data recovery may not be possible.

FIG. 1 is a simplified block diagram illustrating a system 100 including a host system 102 coupled to a flash memory device 104. The flash memory device 104 may include a flash memory controller 106, and a flash memory 108, according to some embodiments. In some implementations, the flash memory 108 can be any non-volatile memory, e.g., a NAND flash. In some implementations, the flash memory 108 can be a NOR flash memory configured to interact externally as a NAND flash. The flash memory 108 can be designed to store data in the absence of a continuous or substantially continuous external power supply. In some examples, the flash memory 108 can be used for secondary data storage, e.g., in a computer system such as a laptop. In such examples, the flash memory device 104 can replace a magnetic hard disk drive (HDD). In some examples, the flash memory controller 106 can be external to the flash memory device 104. In some such examples, the flash memory controller 106 can interact with a plurality of flash memories. The architecture and organization of one example flash memory will be provided later in the specification. In some embodiments, other non-volatile memory can be used in place of or in addition to the flash memory 108. Examples can include read only memory (ROM), a mask ROM (MROM), a programmable ROM (PROM), an erasable programmable ROM (EPROM), an electrically erasable programmable ROM (EEPROM), Ferroelectric RAM (F-RAM), Magnetoresistive RAM (RAM), polymer-based organic memory, holographic memory, phase change memory and the like.

The host system 102 can include any appropriate hardware device, software application, or a combination of hardware and software. In some embodiments, the host system 102 can include a host-side controller (not shown). In some embodiments, the flash memory controller 106 can interface between the host system 102 and the flash memory 108. The flash memory controller 106 can be configured to receive various commands from the host system 102 and interface with the flash memory 108 based on these commands. The flash memory controller 106 can enable the flash memory 108 to perform various operations based on control signals received from the host system 102. In examples, this can enable the host system 102 to program, erase, read, or trim parts of the flash memory 108.

In some embodiments, in addition to or instead of an internal volatile memory, the flash memory controller 106 can interface with an external volatile memory. For example, the flash memory controller 106 can have access to an external DRAM where data can be stored before being transferred to a non-volatile memory.

In some embodiments, the flash memory controller 106 may be configured to perform background media scan (BGMS) to perform error detection and correction in the background. For example, the flash memory controller 106 may perform BGMS in the idle or low power mode. The BGMS can identify defective blocks and may attempt to repair the defective blocks during idle time. For example, in some instances, the BGMS may scan the flash memory 108 periodically to detect bad blocks. The BGMS may perform error correction in order to recover the data from the bad blocks.

Figure 2:
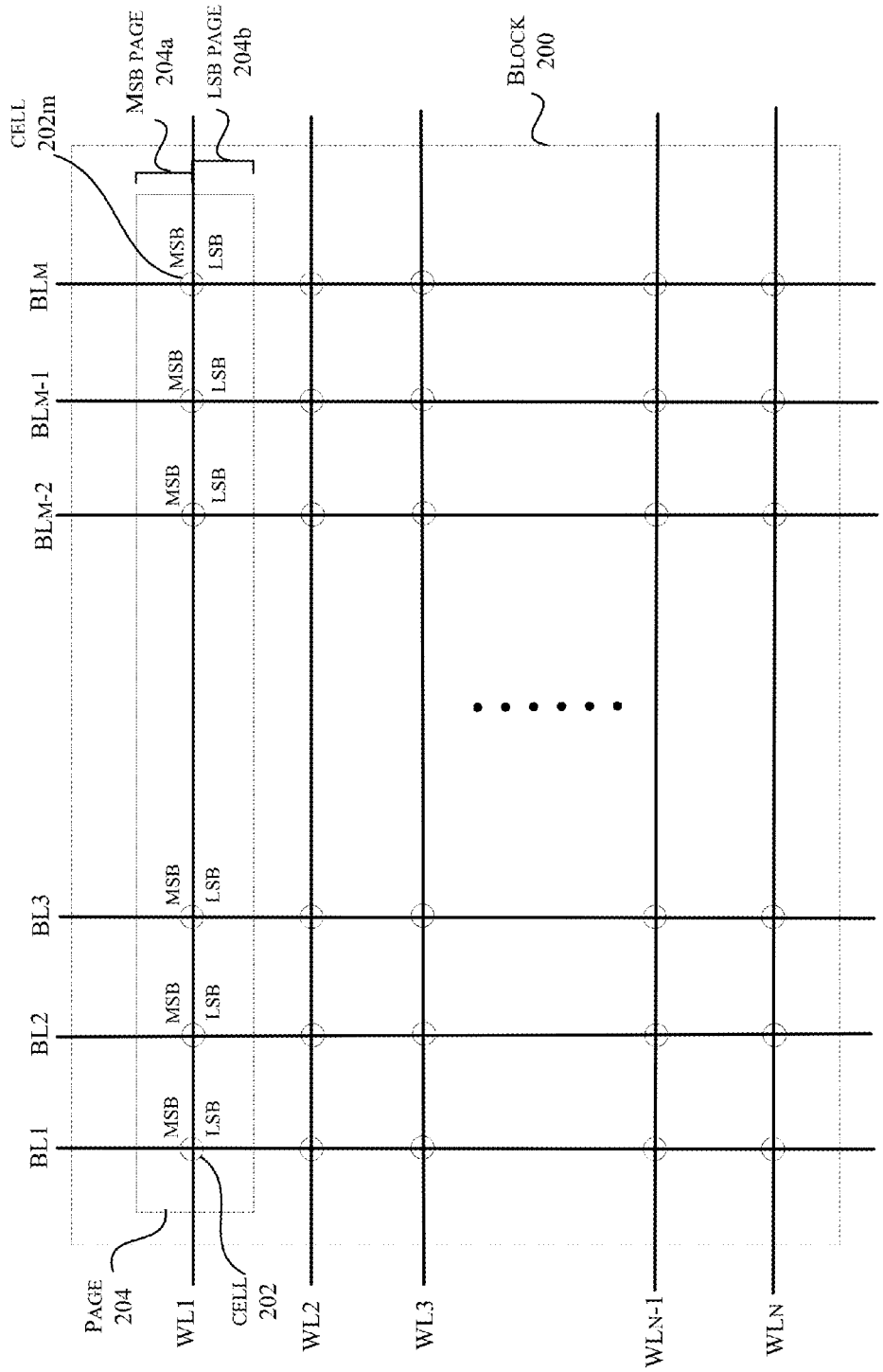
FIG. 2 is an illustration of the organization of a flash memory block of a flash memory, according to some embodiments.

FIG. 2 is an illustration of the organization of a flash memory block of the flash memory 108, according to some embodiments. It is to be noted that the structure shown in FIG. 2 is for illustrative purposes only and the actual physical organization of the flash memory can differ substantially from the depiction.

Generally a NAND flash device is made up of NAND flash cells. An SLC (single level cell) NAND cell can support one bit per cell, and an MLC (multi-level cell) NAND cell can support M bits per cell (e.g., 2 bits per cell for M=2). Single NAND flash cells that individually store a single bit of 0 or 1 can be joined together in strings and arrays to form much larger data storage structures. These strings can be connected to allow storage and retrieval of data from selected cells. A row of NAND cells can make up a word-line (WL) and is generally the smallest unit to program. A page generally shares the same word-line and can comprise thousands of NAND flash cells. For example, typical page sizes can include 32K, 64K or 128K NAND cells. A block can include a two-dimensional matrix comprising pages (rows) and strings (columns). For example, block sizes of 8 M bytes are known.

FIG. 2 illustrates an example flash memory block 200, according to some embodiments. The block 200 may include a two-dimensional matrix comprising pages (rows) and strings (columns). Each block can include multiple pages, e.g., 64, 128, 256, or 512. Some non-limiting examples of the page sizes may include 2 KB, 8 KB, etc. Block sizes of 8 MB are known. Each page may be a logical representation of a physical word-line (WL), and each string may be a logical representation of a bit line (BL). A page is generally a minimum unit to program. As illustrated in the figure, the two-dimensional matrix may include a plurality of word-lines WL1, WL2, WL3, . . . , $WL_{N-1}$, $WL_N$, and a plurality of bit lines BL1, BL2, BL3, . . . , $BL_{M-2}$, $BL_{M-1}$, $BL_M$. As an example, N can be a positive integer with a value of 256, and M can be a positive integer with a value of 32 or 64. In this specification, terms "flash memory block" and "block" may be used interchangeably.

For illustrative purposes, a cell can be represented by a cross-section of a word-line and a bit line. For example, a cell 202 is shown at the cross-section of the WL1 and the BL1, and a cell 202m is shown at the cross-section of the WL1 and the $BL_M$. Each page may include a plurality of cells similar to the cell 202. For example, a page 204 may include the cells 202, . . . , 202m. In some embodiments, each cell in the block 200 may be a multi-level cell (MLC), e.g., each cell may store multiple binary bits. In some implementations, each cell may store two binary bits and hence can support four states, e.g., "10", "11", "01", and "00." The left bit from the two bits can be called the most significant bit (MSB) and the right bit can be called the least significant bit (LSB). Generally, in MLC flash, two bits within a single cell are not mapped to the same page. In some implementations, all the MSBs on a word-line form an MSB page, and all the LSBs on the word-line form an LSB page. As illustrated in FIG. 2, an MSB page 204a may include the MSBs associated with all the cells on the WL1, and an LSB page 204b may include the LSBs associated with all the cells on the WL1. The flash memory 108 can be programmed or read page by page. In certain embodiments, the NAND pages can be programmed in sequential order and read in random order.

Some flash memory blocks may get corrupted or bad over time. For example, multiple program-erase (P/E) cycles, part failures, bit errors, or physical defects that may worsen with time and usage can contribute to bad blocks. As flash density increases, NAND flash memory cells can be more subject to various device and circuit level noises, leading to increasingly worse reliability and endurance. The reliability and endurance can further decrease for multi-level cells, thus increasing the error rates. Effect of a bad word-line is shown with reference to FIG. 7.

Figure 7:
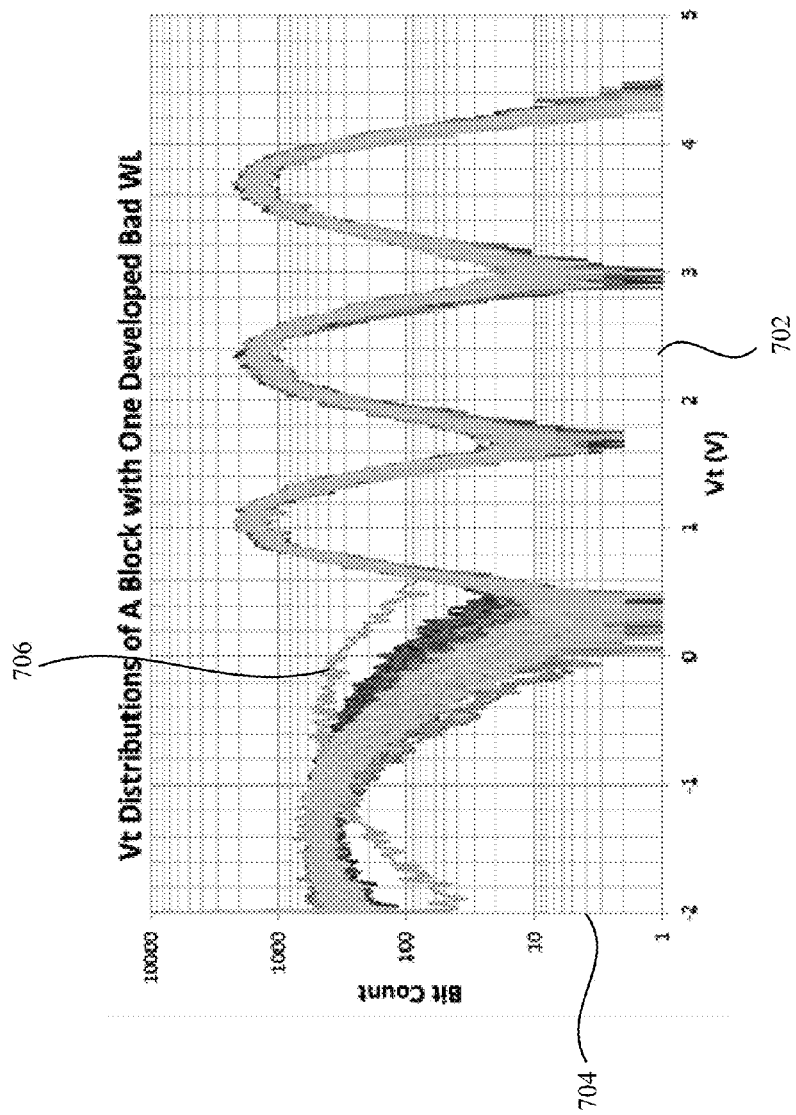
FIG. 7 illustrates a graph of a threshold voltage (Vt) distribution of a block versus bit count, in one embodiment.

FIG. 7 illustrates a graph 700 of a threshold voltage ($V_t$) distribution 702 of a block versus bit count 704.

As illustrated in the figure, behavior of the $V_t$ distribution 702 for a developed bad word-line 706 is different than the normal word-lines. The distortion in the $V_t$ distribution 702 can cause a crossover of the reference voltage levels during a read operation. Thus, for an M-bit MLC cell, it may be difficult to distinguish a cell state for the bad word-line 706. This may result in higher bit errors.

Typically, the flash memory devices can be scanned periodically to detect bad blocks and retire them as needed. For example, a process known as background media scan (BGMS) can be executed to perform error detection and correction in the background. In some embodiments, the flash memory controller 106 may perform an improved BGMS process that can predict which word-line for a flash memory block is to be developed into a bad word-line. The bad word-line may correspond to an MSB page or an LSB page. Accordingly, the BGMS process can retire the flash memory block that includes the bad word-line, after recovering the data. This is further explained with reference to a flow chart in FIG. 3.

Figure 3:
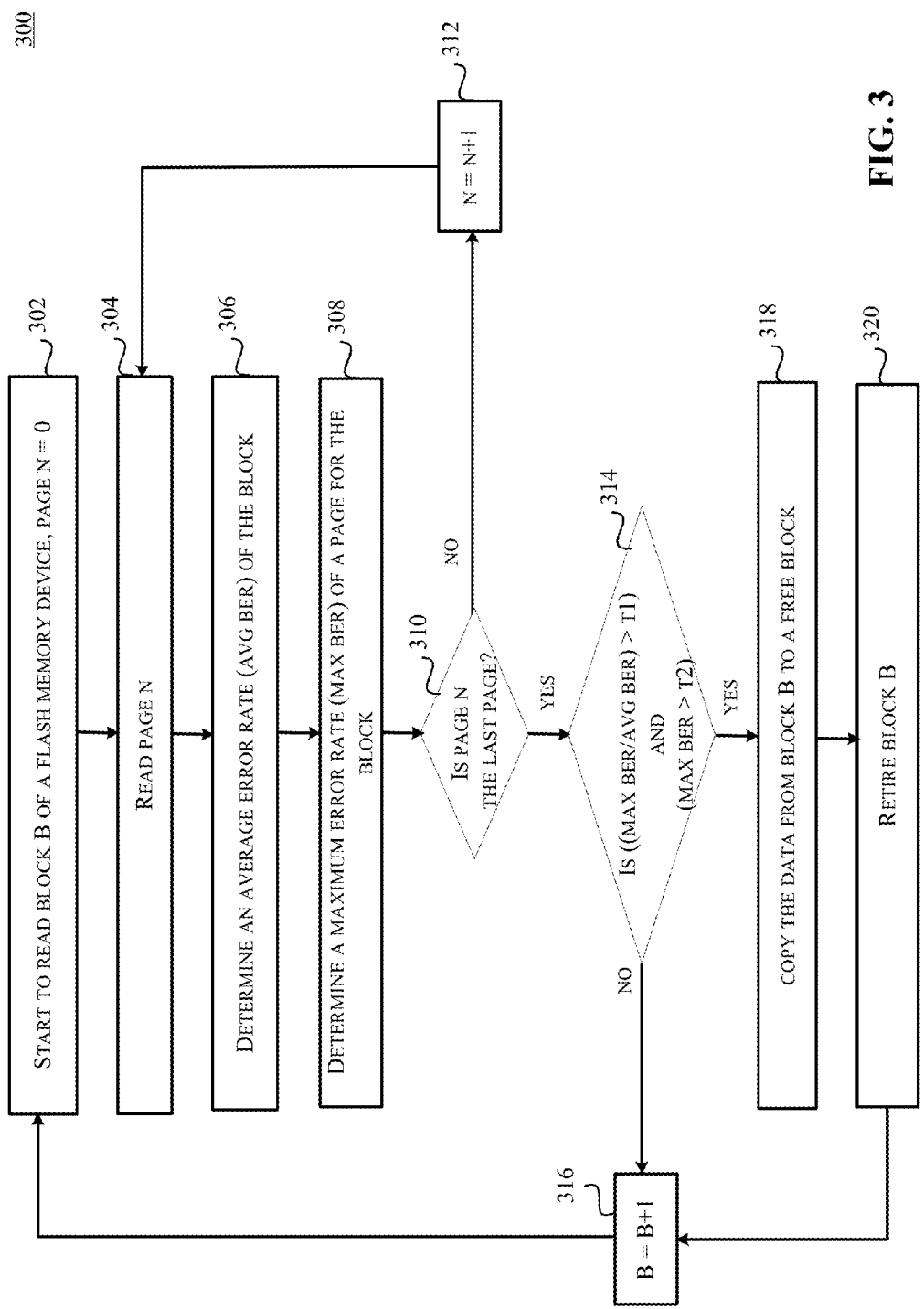
FIG. 3 illustrates a method performed as part of the BGMS to predict a bad word-line, in accordance with some embodiments.

FIG. 3 illustrates a method 300 performed by the BGMS to predict a bad word-line, in accordance with some embodiments. In some implementations, the method 300 may be performed by the flash memory controller 106. According to some embodiments, the method 300 may be performed for all the MSB pages in a flash memory, or all the LSB pages in a flash memory. For example, independent methods may be executed in parallel for the MSB pages and the LSB pages to predict a bad word-line corresponding to an MSB page or an LSB page.

In step 302, a first block of a flash memory device may be read. In some implementations, variables "B" and "N" may include positive integers that can represent a block count and a page count respectively. For example, at the start of the BGMS process, the block count B and the page count N may be set to "0", i.e., a first page of a first block may be read by the BGMS process. Referring back to FIG. 2, the first block may be the block 200 of the flash memory 108. The first page may be the MSB page 204a or the LSB page 204b. According to some embodiments, the method 300 may be performed by the BGMS process to read all the MSB pages or all the LSB pages. In some embodiments, a first method to read all the MSB pages and a second method to read all the LSB pages may be performed in parallel.

In step 304, the first page of the first block may be read. For example, the flash memory controller 106 may read the first word-line WL1 to read the MSB page 204a or the LSB page 204b. In some implementations, data read from the first page may be stored in a buffer in the flash memory device 104. In the embodiments, the pages can be read at near-optimal read levels.

In step 306, an average error rate (AVG BER) of the block may be determined. According to some embodiments, the average error rate of the block may be determined by calculating a sum of error rates of the pages read, and dividing the sum by the number of pages read. For example, for the first page read from the flash memory device, the average error rate may be the error rate of the first page divided by "1." For the second page read from the flash memory device, the average error rate may be the sum of the error rates of the first page and the second page divided by "2." If a first error rate of the first page is 14 and a second error rate of the second page is 12, the average error rage of the block may be ((14+12)/2=13).

In step 308, a maximum error rate (MAX BER) of a page for the block may be determined. According to some embodiments, the maximum error rate of the block may be determined by comparing error rates of the pages read and identifying a page with a highest error rate. For example, for the first page read from the flash memory device, the maximum error rate may be the error rate of the first page. For the second page read from the flash memory device, the maximum error rate may be the higher error rate between the first page and the second page. Using the above example, the maximum error rate of the first page may be 14. After reading the second page, the maximum error rate may still be 14. If a third error rate for a third page is 20, the maximum error rate for the block may be changed to 20.

In step 310, the method 300 may determine if all the pages have been read. If the page count N has reached to maximum, the method may move forward to step 314. If all the pages have not been read, the method 300 may continue reading the pages of the block B until the page count N has reached to the maximum page count for that block.

In step 312, the page count may be increased by 1 to read the next page in step 304. The average error rate for the next page may be calculated in the step 306. The maximum error rate between a current page and the previous page may be determined in step 308. The method 300 may continue determining the average error rate of the block and the maximum error rate of a page for the block until all the N pages have been read.

In step 314, the method 300 may determine if a ratio of the maximum error rate (MAX BER) of a page to the average error rate (AVG BER) of the block is more than a first threshold T1, and if the maximum error rate of the page is more than a second threshold T2. If both the conditions hold true, the method 300 may predict that the block is likely to develop into a bad block. For example, the ratio of the maximum error rate of a page to the average error rate of the block being more than the first threshold T1 may be relevant if the maximum error rate is above a certain value (e.g., T2). In other words, the block may likely develop into a bad block if the maximum error rate deviates by a significant amount from the average error rate, and the maximum error rate is a large value. The threshold T1 and T2 may be pre-determined. In some embodiments, the T1 and T2 may be determined based on the ECC capability of the flash memory device 104. As an example, in some embodiments, T1 and T2 can be determined based on a deviation from how many bits can be corrected using the ECC. In another example, a normal ratio between an average error rate and a maximum error rate can be on the order of 2-3. Hence, T1 and T2 can be determined to identify a bad word-line beyond the normal ratio.

In step 316, if the current block is not predicted to be a bad block, the method 300 may increment the block count B by 1 and start reading the next block in step 302. For example, the method may start with the first page of the next block in the step 302. The method 300 may iterate through the steps 302, 304, 306, 308, 310, 312 and 314 to identify a block which can be predicted to be a bad block.

In step 318, data from the bad block B may be copied to a free block. For example, once it is determined in the step 314 that the block B may develop into a bad block, data stored on the block B can be retrieved and copied to a free or available block. It will be understood that other methods of recovering the data from the block B may be possible.

In step 320, the block B may be retired. Once the data has been retrieved from the block B, the block B may be marked unusable. In some instances, the data can be left on the block B once a copy of the data is available on another block.

As discussed with reference to FIG. 3, various embodiments can be used to predict a developed bad block that can be retired without the need for "chipkill."

Figure 4:
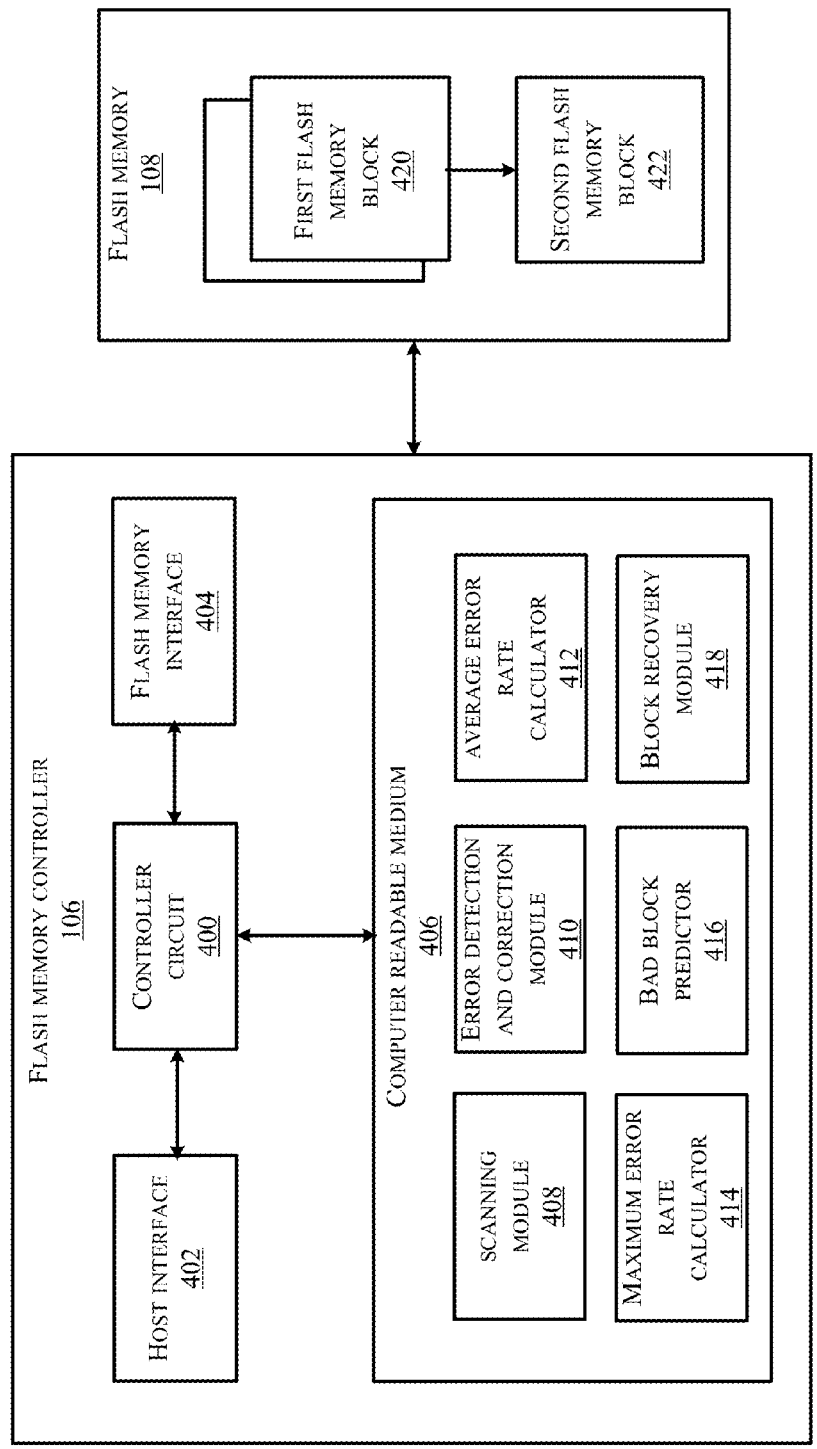
FIG. 4 illustrates a detailed block diagram of the flash memory controller coupled to the flash memory, in some embodiments.

FIG. 4 illustrates a detailed block diagram of the flash memory controller 106 coupled to the flash memory 108, in some embodiments. In some implementations, the flash memory controller 106 may include a controller circuit 400 communicatively coupled to a host interface 402, a flash memory interface 404 and a computer readable medium 406.

The flash memory 108 may include a plurality of flash memory blocks, e.g., a first flash memory block 420 and a second flash memory block 422. The plurality of flash memory blocks may be on different planes on a flash memory die. The first flash memory block 420 and the second flash memory block 422 may be on the same plane or different planes. In example, flash memory devices, program operations take place at a 'page' level, while blocks can represent the smallest unit that can be erased. When data in an existing page has to be updated, the entire block has to be erased before the updated data can be reprogrammed. In these flash memory devices, the system can reserve a certain number of free blocks to be used when an update request, i.e., a new program request, is received, or data is copied from a bad block. As an example, the first flash memory block 420 may be the block 200, as discussed with reference to FIG. 2, and the second flash memory block 422 may be a free block.

The flash memory interface 404 can include elements (e.g., hardware, software, firmware or any combination thereof) necessary for supporting a flash memory interface protocol. While still forming part of flash memory device 104, in some embodiments, the flash memory controller 106 can physically form a separate device from the flash memory chip 108. In other embodiments, the flash memory controller 106 can be integrated with the flash memory chip 108 to form the flash memory device 104, as discussed with reference to FIG. 1.

The host interface 402 can be used to communicate with a host, such as the host system 102 of FIG. 1. The host interface 402 can include elements (e.g., hardware, software, firmware or any combination thereof) necessary for supporting a host interface protocol.

The controller circuit 400 can refer to any processing logic, including but not limited to a processor or processing core associated with a processor, Application Specific Integrated Circuit (ASIC), Field Programmable Gate Array (FPGA), or any other circuitry configurable to execute instructions. In some embodiments, the instructions may be stored on the computer-readable storage medium 406, e.g., in the form of a computer program. Although not shown in FIG. 3, the flash memory controller 106 can further comprise a volatile memory such as a DRAM, a Double Data Rate DRAM (DDR DRAM), or a Static RAM (SRAM). In general, the volatile memory can refer to any memory media where the stored data is lost in the absence of continuous or substantially continuous power supply.

The computer readable medium 406 may be in the form of a memory. The computer-readable storage medium 406 may be non-transitory. In some embodiments, the computer-readable storage medium 406 may include but are is limited to, SRAM, DRAM, read only memory (ROM), electrically erasable programmable read-only memory (EEPROM), or any other medium which can be used to store the desired information and which can be accessed by controller circuit 400. In some implementations, the computer readable medium 406 may include a plurality of modules, e.g., a scanning module 408, an error detection and correction module 410, an average error rate calculator 412, a maximum error rate calculator 414, a bad block predictor 416, and a block recovery module 418.

In some embodiments, the BGMS process may be used to detect and correct errors in the flash memory 108, similar to the data scrubbing process performed by a RAID controller. The BGMS process may be executed in the background when the system is in the idle mode or low power mode. For example, in some implementations, the BGMS process may be executed after not receiving a command for certain duration, e.g., 500 ms. Various embodiments can implement an improved BGMS process to detect a developed bad block during the flash memory usage so that the data can be recovered in time. According to the embodiments, the improved BGMS process can predict which word-lines are likely to develop into a bad word-line based on variation in the error rates of different pages in a flash memory block. In some embodiments some of the modules of the computer readable medium 406 may be part of the improved background media scan (BGMS) process.

The scanning module 408 may be configured to read the flash memory 108 through the flash memory interface 404. In some embodiments, the scanning module 408 may read the flash memory 108 as part of the BGMS process. For example, the scanning module 408 may read the flash memory 108 during idle time or in low power mode. The scanning module 408 may read the flash memory 108 page by page for each block. For example, referring back to FIG. 2, the scanning module 408 may read the MSB page and the LSB page for each word-line in a sequential or random order. In some embodiments, the data read from the flash memory can be stored in a buffer (not shown) in the flash memory controller 106.

The error detection and correction module 410 may be configured to detect and correct errors in the data read from the flash memory 108. In some implementation, the error detection and correction module 410 may implement a suitable ECC (error correction code) algorithm to implement ECC encoding and decoding. Examples of ECC can include Hamming codes for SLC NAND flash and Reed-Solomon codes and Bose-Chaudhuri-Hocquenghem (BCH) codes for MLC NAND flash. In some implementations, an error rate, or a bit error rate (BER) may be defined as a percentage of bits with errors divided by a total number of bits for a given unit. Error detection and correction can be implemented in software, hardware or a combination thereof. In some embodiments, the error detection and correction module 410 may read the flash memory 108, attempt to correct the errors and write the corrected data back into the flash memory 108 as part of a garbage collection process.

The average error rate calculator 412 may be configured to determine an average error rate of a flash memory block, e.g., the first flash memory block 420. In one implementation, the average error rate calculator 412 may determine an average error rate of the flash memory block by adding the error rates of the pages read from the flash memory block and dividing by the number of pages read. For example, the scanning module 408 may read a first page from the first flash memory block 420. As an example, a first error rate for the first page may be 8. A second page read from the first flash memory block 420 may have an error rate of 14. The average error rate calculator 412 may calculate the average error rate for the first flash memory block 420 to be 11 (e.g., (8+14)/2). Similarly, for a third error rate of 12 for a third page, the average error rate for the first flash memory block 420 may be 17 (e.g., (8+14+12)/3), and so on.

The maximum error rate calculator 414 may be configured to determine a maximum error rate for a flash memory block, e.g., the first flash memory block 420. As an example, the maximum error rate may be determined by comparing the error rates of the pages read from the flash memory block and identifying a highest error rate. In one implementation, as the pages are read from the first flash memory block 420, the maximum error rate calculator 414 may compare the error rate of the current page with the error rate of the previous page and assign the higher value to be the maximum error rate. For example, as discussed previously, with the first error rate of 8 for the first page, the maximum error rate can be 8. When the second page is read from the flash memory block, the maximum error rate calculator 414 may compare the second error rate (e.g., 14) with the first error rate (e.g., 8) and assign the maximum error rate to be 14. When the third page is read from the flash memory block, the maximum error rate calculator 414 may compare the third error rate (e.g., 12) with the second error rate (e.g., 14) and assign the higher value to be the maximum error rate (e.g., 14).

The bad block predictor 416 may be configured to predict if a flash memory block will be developed into a bad memory block. In some embodiments, the bad block predictor 416 may identify a page that has a maximum error rate which is significantly higher than the average error rate of the flash memory block. For example, according to some embodiments, the significantly higher can be defined as being higher than a certain predetermined ratio. The page can be an MSB page or a LSB page. Thus, in the embodiments, if a ratio of the maximum error rate to the average error rate is higher than a first threshold (e.g., T1), the bad block predictor 416 may predict that the word-line with the maximum error rate is likely to develop into a bad word-line. Further, the bad block predictor 416 may mark the flash memory block to be retired if the maximum error rate is higher than a second threshold (e.g., T2). In some implementations, the first threshold and the second threshold may be pre-determined and stored in a memory or a register (not shown) in the flash memory controller 106. The first threshold and the second threshold may be determined based on the ECC capability (e.g., error correction capability) of the flash memory device 104, acceptable deviation from a normal ratio between the maximum and average error rate (e.g., 2 or 3) based on the collected data, or using another suitable criteria. An example variation is discussed with reference to FIG. 6.

The block recovery module 418 may be configured to recover the data from a flash memory block that has been marked to be retired, e.g., by the bad block predictor 416. For example, if the first flash memory block 420 has been marked to be retired, the block recovery module 418 may transfer the data from the first flash memory block 420 to a free flash memory block, e.g., the second flash memory block 422. In some implementations, the data from the first flash memory block 420 may be copied to the second flash memory block 422 and the first flash memory block 420 may be marked as unusable. It will be understood that once a flash memory block has been identified as a bad block using the embodiments, various methods to recover the data from the bad block are possible without deviating from the scope of the disclosed technologies.

Figure 5:
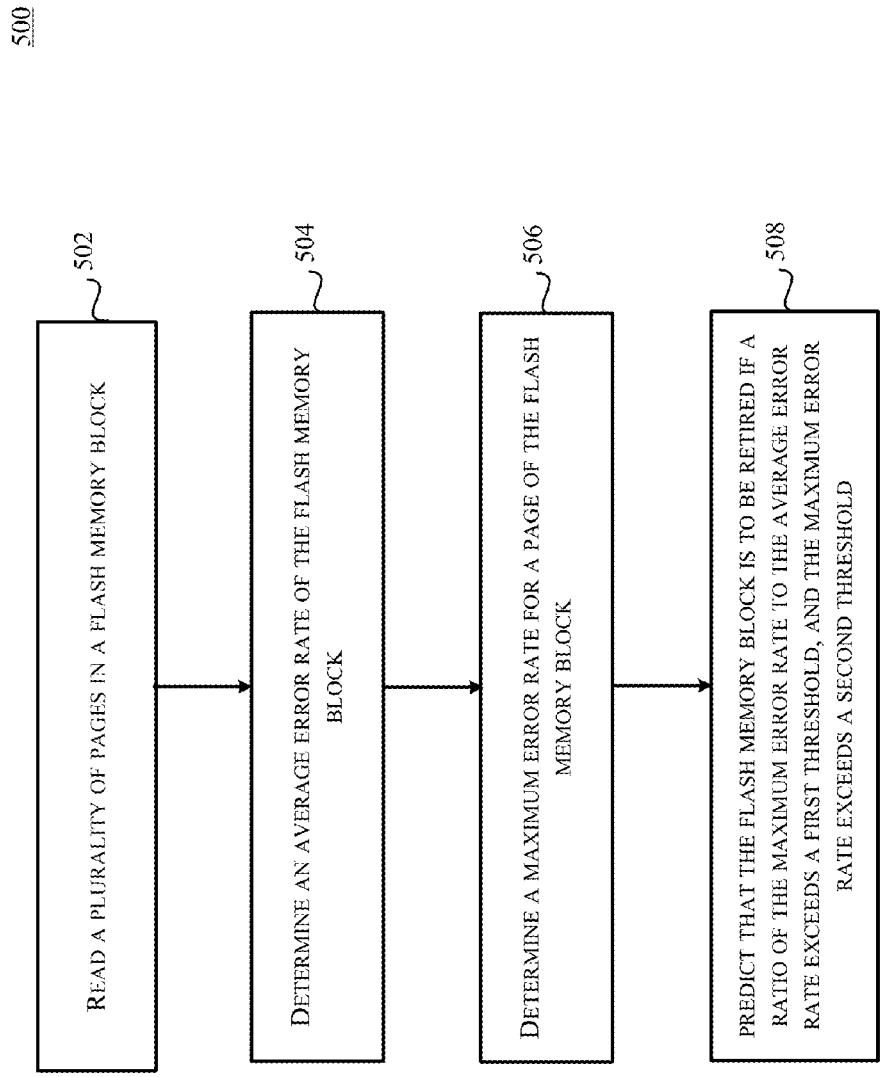
FIG. 5 illustrates a method to predict a developed bad block using an improved BGMS process, in one embodiment.

FIG. 5 illustrates a method 500 to predict a developed bad block using an improved BGMS process, in one embodiment. The method 500 may be executed by the flash memory controller 106. For example, the controller circuit 400 may execute instructions stored in the computer readable medium 406 to perform the improved BGMS process to predict the developed bad block. The method 500 may utilize the method 300 as discussed with reference to FIG. 3.

In step 502, a plurality of pages in a flash memory block can be read by the flash memory controller 106. Referring back to FIG. 1 and FIG. 2, the flash memory controller 106 may read $WL_1, \ldots, WL_N$ for the block 200. The plurality of pages may include the MSB pages or the LSB pages. In some embodiments, all the MSB pages can be read in sequential order, and all the LSB pages can be read in sequential order. In some embodiments, the MSB pages and the LSB pages can be read in random order. In some embodiments, the MSB pages and the LSB pages can be read in parallel using different processes.

In step 504, an average error rate of the flash memory block may be determined. For example, as discussed with reference to FIG. 4, the average error rate calculator 412 may determine the average error rate of the block 200 once all the pages are read from the block 200. For example, the average error rate can be determined by calculating a sum of the error rates for all the pages in the block 200, and dividing the sum by the number of pages in the block 200 (e.g., N pages).

In step 506, a maximum error rate for a page of the flash memory block may be determined. For example, as discussed with reference to FIG. 4, the maximum error rate calculator 414 may determine the maximum error rate for a page of the block 200 once all the pages are read from the block 200. For example, the maximum error rate can be calculated by identifying a page with a highest error rate from all the pages read from the block 200.

In step 508, the bad block predictor 416 may predict that the block 200 will be developed into a bad block if a ratio of the maximum error rate to the average error rate exceeds a first threshold (T1), and the maximum error rate exceeds a second threshold (T2). The block recovery module 418 may recover the data from the bad block and may mark the bad block 200 as unusable.

Figure 6:
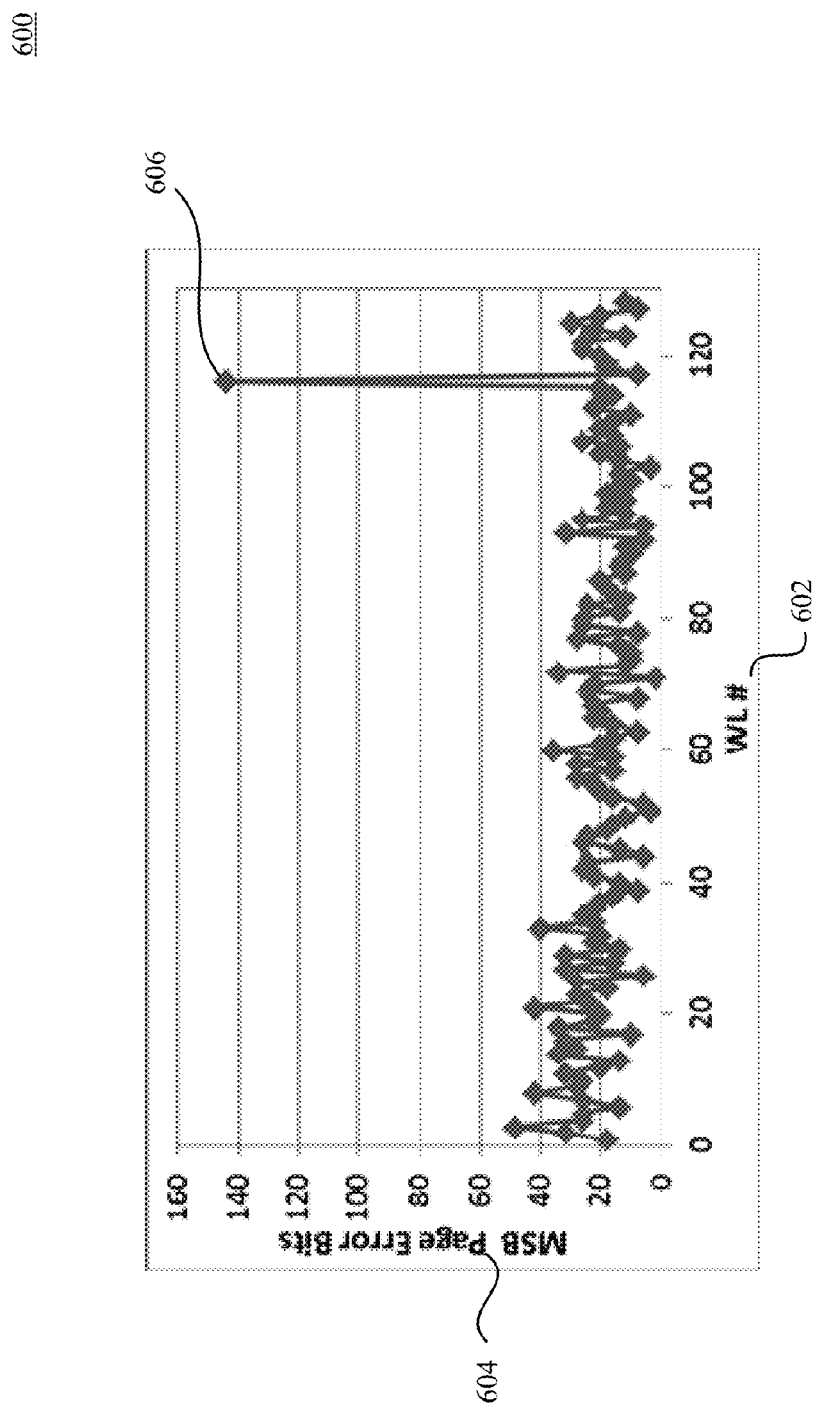
FIG. 6 illustrates a graph of MSB page error bits versus word-line, in one embodiment.

FIG. 6 illustrates a graph 600 of MSB page error bits 604 versus word-line 602, in one embodiment.

As illustrated in the graph 600, the MSB page error bits 604 is significantly higher around the value 120 for the word-line 602, as represented by a spike 606. Thus a maximum error rate for the worst WL 602 is close to 148. Assuming the average error rate is about 20, the ratio of the maximum error rate to the average error rate for a WL (e.g., WL # close to 118) is about 7.4. On the contrary, the ratio of other WLs is between "0.1" to "2.5." Thus, if the first threshold T1 is close to "5", the bad block can be identified before it develops to a UECC failure. Further, if the second threshold T2 is set to 100, the maximum error rate (e.g., 148) for the WL #120 will be more than T2, and hence the improved BGMS process can predict that the WL #120 may be developed into a bad word-line. As discussed with reference to FIGS. 2-5, the bad block can be retired after recovering the data from the bad block.

As discussed with reference to FIGS. 1-5, some embodiments of the disclosure can have the potential to detect the developed bad blocks and eliminate the need of the expensive "chipkill" method. Thus, using various embodiments, a block, which is in progress to develop into a bad block can be identified before it eventually becomes bad. Hence, loss of data can be prevented by recovering the data from a possible bad block before the block develops into the bad block from which data recovery may not be possible.

What is claimed is:

1. A flash memory device comprising:
a flash memory comprising:
a flash memory block comprising a plurality of pages, each page comprising a plurality of M-level cells, each M-level cell storing M bits of data; and
a circuit comprising processing logic coupled to the flash memory and configured to:
read the plurality of pages in the flash memory block, wherein each page is associated with a respective bit error rate;
determine an average bit error rate of the flash memory block based on bit error rates of the plurality of pages;
determine a maximum bit error rate of a page of the plurality of pages in the flash memory block;
predict, as part of performing a background media scan (BGMS) process, that the flash memory block is going to develop into a bad block if a ratio of the maximum bit error rate to the average bit error rate exceeds a first threshold, and if the maximum bit error rate exceeds a second threshold; and
retire the flash memory block based on the prediction that the flash memory block is going to develop into a bad block.

2. The flash memory device of claim 1, wherein based on the prediction, the circuit is further configured to:
copy data stored in the flash memory block to a free flash memory block, and wherein the flash memory block is retired by at least marking the flash memory block as unusable.

3. The flash memory device of claim 1, wherein the average bit error rate is determined by calculating a sum of the bit error rates of the plurality of pages in the flash memory block, and dividing the sum by a number of pages in the plurality of pages.

4. The flash memory device of claim 1, wherein the maximum bit error rate of the page is determined by identifying the page having a highest bit error rate among the bit error rates of the plurality of pages.

5. The flash memory device of claim 1, wherein the plurality of pages include pages associated with a most significant bit (MSB) of each M-level cell.

6. The flash memory device of claim 1, wherein the plurality of pages include pages associated with a least significant bit (LSB) of each M-level cell.

7. The flash memory device of claim 1, wherein the M is 2 and the plurality of M-level cells include multilevel cells (MLCs).

8. The flash memory device of claim 1, wherein the bad block is a developed bad flash memory block due to the usage of the flash memory device.

9. The flash memory device of claim 1, wherein the plurality of pages are read at near-optimal read levels.

10. The flash memory device of claim 1, wherein the first threshold and the second threshold are defined based on a deviation from an error correction coding (ECC) capability of the flash memory device.

11. The flash memory device of claim 1, wherein the first threshold and the second threshold are defined based on a predefined ratio between the average bit error rate and the maximum bit error rate.

12. A method comprising:
reading, by a flash memory controller, a plurality of pages in a flash memory block of a flash memory, wherein the flash memory is coupled to the flash memory controller, and wherein each page of the plurality of pages comprises a plurality of M-level cells, each M-level cell storing M bits of data;
determining an average bit error rate of the flash memory block based on bit error rates of the plurality of pages;
determining a maximum bit error rate of a page of the plurality of pages in the flash memory block;
determining that a ratio of the maximum bit error rate to the average bit error rate exceeds a first threshold;
predicting, as part of performing a background media scan (BGMS) process, that the flash memory block is going to be a bad block based on the ratio, and if the maximum bit error rate exceeds a second threshold; and
retiring the flash memory block based on the prediction that the flash memory block is going to develop into a bad block.

13. The method of claim 12 further comprising:
based on the prediction, copying data from the flash memory block to a free memory block, and wherein retiring the flash memory block comprises marking the flash memory block as unusable.

14. The method of claim 12, wherein the average bit error rate is determined by calculating a sum of bit error rates associated with the plurality of pages in the flash memory block, and dividing the sum by a number of pages in the plurality of pages.

15. The method of claim 12, wherein the maximum bit error rate is determined by identifying the page having a highest bit error rate among the bit error rates of the plurality of pages.

16. The method of claim 12, wherein the plurality of pages include pages associated with a most significant bit (MSB) of each M-level cell.

17. The method of claim 12, wherein the plurality of pages include pages associated with a least significant bit (LSB) of each M-level cell.

18. A non-transitory computer readable medium having stored thereon instructions that, when executed by a processor, perform a method, comprising:
reading a plurality of pages from a flash memory block of a flash memory, and wherein each page of the plurality of pages comprises a plurality of M-level cells, each M-level cell storing M bits of data;
determining an average bit error rate of the flash memory block based on bit error rates of the plurality of pages;
determining a maximum bit error rate of a page of the plurality of pages in the flash memory block;
determining that a ratio of the maximum bit error rate to the average bit error rate exceeds a first threshold;
predicting, as part of performing a background media scan (BGMS) process, that the flash memory block is going to be a bad block based on the ratio, and if the maximum bit error rate exceeds a second threshold; and retiring the flash memory block based on the prediction that the flash memory block is going to develop into a bad block.

19. The non-transitory computer readable medium of claim 18, the method further comprising:
based on the prediction, copying data from the flash memory block to a free memory block, and wherein retiring the flash memory block comprises marking the flash memory block as unusable.

20. The non-transitory computer readable medium of claim 18, wherein the processor is part of a flash memory controller coupled to the flash memory.

* * * * *